US006314538B1

(12) United States Patent
Ochoa et al.

(10) Patent No.: US 6,314,538 B1
(45) Date of Patent: *Nov. 6, 2001

(54) SEMICONDUCTOR INTEGRATED CIRCUIT HAVING COMPRESSION CIRCUITRY FOR COMPRESSING TEST DATA, AND THE TEST SYSTEM AND METHOD FOR UTILIZING THE SEMICONDUCTOR INTEGRATED CIRCUIT

(75) Inventors: Roland Ochoa; Gregory L. Cowan, both of Boise; Kim M. Pierce, Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/175,518

(22) Filed: Oct. 20, 1998

Related U.S. Application Data

(63) Continuation of application No. 08/881,946, filed on Jun. 25, 1997, now Pat. No. 5,864,565, which is a continuation of application No. 08/353,404, filed on Dec. 9, 1994, now abandoned, which is a continuation-in-part of application No. 08/077,182, filed on Jun. 15, 1993, now abandoned.

(51) Int. Cl.[7] .................................................. G01R 31/28
(52) U.S. Cl. .......................... 714/724; 365/201; 324/765
(58) Field of Search .................................... 714/724, 735, 714/738, 734, 732–736; 324/765, 763; 365/201

(56) References Cited

U.S. PATENT DOCUMENTS

| 4,517,661 | 5/1985  | Graf et al. ............................. 714/25 |
| 4,637,020 | 1/1987  | Schinabeck .......................... 714/736 |
| 4,656,632 | 4/1987  | Jackson ................................ 714/736 |
| 4,760,330 | 7/1988  | Lias, Jr. ................................. 714/32 |
| 4,794,597 | 12/1988 | Ooba et al. .......................... 714/703 |
| 4,799,004 | 1/1989  | Mori ..................................... 714/726 |
| 4,827,476 | 5/1989  | Garcia ................................. 714/728 |
| 4,837,765 | 6/1989  | Suzuki ................................ 714/724 |
| 4,860,259 | 8/1989  | Tobita ................................. 365/201 |
| 4,864,579 | 9/1989  | Kishida et al. ...................... 714/726 |
| 4,879,717 | 11/1989 | Sauerwald et al. .................. 714/727 |
| 4,916,700 | 4/1990  | Ito et al. ............................. 714/718 |
| 4,926,426 | 5/1990  | Scheuneman et al. ............. 714/772 |
| 4,965,799 | 10/1990 | Green et al. ......................... 714/719 |
| 4,996,691 | * 2/1991 | Wilcox et al. ....................... 714/820 |
| 5,005,173 | 4/1991  | Martin ................................. 714/734 |
| 5,051,997 | * 9/1991 | Sakashita et al. ................... 714/732 |
| 5,072,137 | 12/1991 | Slemmer .............................. 326/16 |
| 5,130,646 | 7/1992  | Kojima ............................... 324/73.1 |
| 5,293,386 | 3/1994  | Muhmenthaler et al. ........... 714/718 |
| 5,305,261 | 4/1994  | Furutani et al. ................. 365/189.01 |
| 5,311,473 | 5/1994  | McClure et al. .................... 365/201 |
| 5,422,892 | * 6/1995 | Hii et al. ............................. 714/735 |
| 5,457,696 | 10/1995 | Mori ................................... 714/720 |
| 5,475,692 | 12/1995 | Hatano et al. ...................... 714/719 |
| 5,825,783 | * 10/1998 | Momohara ......................... 714/718 |

OTHER PUBLICATIONS

Schilling et al., "Electronic Circuits," pp. 615–618, pp. 633–634, p.645, 1989.

* cited by examiner

*Primary Examiner*—Albert Decady
*Assistant Examiner*—Shelly A Chase
(74) *Attorney, Agent, or Firm*—TraskBritt

(57) ABSTRACT

A semiconductor integrated circuit and method for compressing test stimuli to one test output signal during a test mode. The test output signal is driven from one input/output node of the semiconductor integrated circuit to a test station through a load board interface. Buffer circuitry on the semiconductor integrated circuit drive a high impedance to the input/output nodes of the integrated circuit during the test mode. The load board interface allows a single test station to receive test output signals from a plurality of semiconductor integrated circuits of the invention during the test mode, thereby allowing one test station to simultaneously test a plurality of circuits.

24 Claims, 5 Drawing Sheets

SEMICONDUCTOR INTEGRATED CIRCUIT HAVING COMPRESSION CIRCUITRY FOR COMPRESSING TEST DATA, AND THE TEST SYSTEM AND METHOD FOR UTILIZING THE SEMICONDUCTOR INTEGRATED CIRCUIT

This is a continuation of application Ser. No. 08/881,946, filed Jun. 25, 1997, now U.S. Pat. No. 5,864,565, which is a continuation of application Ser. No. 08/353,404, filed Dec. 9, 1994, now abandoned, which is a continuation-in-part of application Ser. No. 08/077,182, filed Jun. 15, 1993, now abandoned.

FIELD OF THE INVENTION

The invention relates to semiconductor integrated circuits and, more particularly, to internal test circuitry of a semiconductor integrated circuit.

BACKGROUND OF THE INVENTION

Semiconductor integrated circuits are typically tested in response to an applied input test signal. The semiconductor integrated circuits respond to the input test signal by providing a test output signal which is monitored to determine if the part has been manufactured correctly. With an increase in storage capacity and memory circuit functions the testing of a semiconductor integrated circuit consumes more time and requires more testing hardware.

In FIG. 1, a memory component tester 5 of the related art is shown which has 4 test stations 7–10. Each test station 7–10 is used to test circuit functions of an individual semiconductor integrated circuit or, during testing known as, a device under test (DUT). Therefore when testing, say, four integrated circuits 12–15, as shown in FIG. 1, four test stations 7–10 are needed. Typically, each test station 7–10 has a number of pins 20 corresponding to the number of I/O (input/output) pins 25 on the DUT for coupling the test station to the DUT during testing. The DUT responds to applied test signals originating in the memory component tester 5 and generates test output signals in response to the applied test signals. The test stations monitor the test output signals to determine if a DUT has been manufactured correctly.

The ability to test in parallel is limited by the number of Pin Electronic Channels with comparator capability a memory component tester may have. How those limited resources are utilized by the product tested on test equipment is directly related to designing a test mode which makes best use of each Pin Electronics Channel. The present Micron Test Mode tri-states each unique I/O pin individually upon failure. This prevents the tying of multiple I/O pins together for greater parallel testing because a failing pin in a high impedance state is driven by a passing pin to a passing voltage level. The driving pin (Passing) would mask the tri-stated (failing) pin which would cause the failure to go undetected, and the failed part would be binned with those which passed testing.

In order to reduce the total manufacture time and decrease manufacturing costs there is a need to develop a faster testing method requiring less test equipment.

SUMMARY OF THE INVENTION

The invention is a semiconductor integrated circuit, method and test system for compressing test stimuli to one test output signal during a test mode. The test output signal is driven from one input/output node of the semiconductor integrated circuit to a test station through a load board interface of the invention. Buffer circuitry on the semiconductor integrated circuit drive a high impedance to the input/output nodes of the integrated circuit during the test mode. The load board interface allows a single test station to receive test output signals from a plurality of semiconductor integrated circuits of the invention during the test mode, thereby allowing one test station to simultaneously test a plurality of circuits.

DETAILED DESCRIPTION OF THE INVENTION

Figure 1:
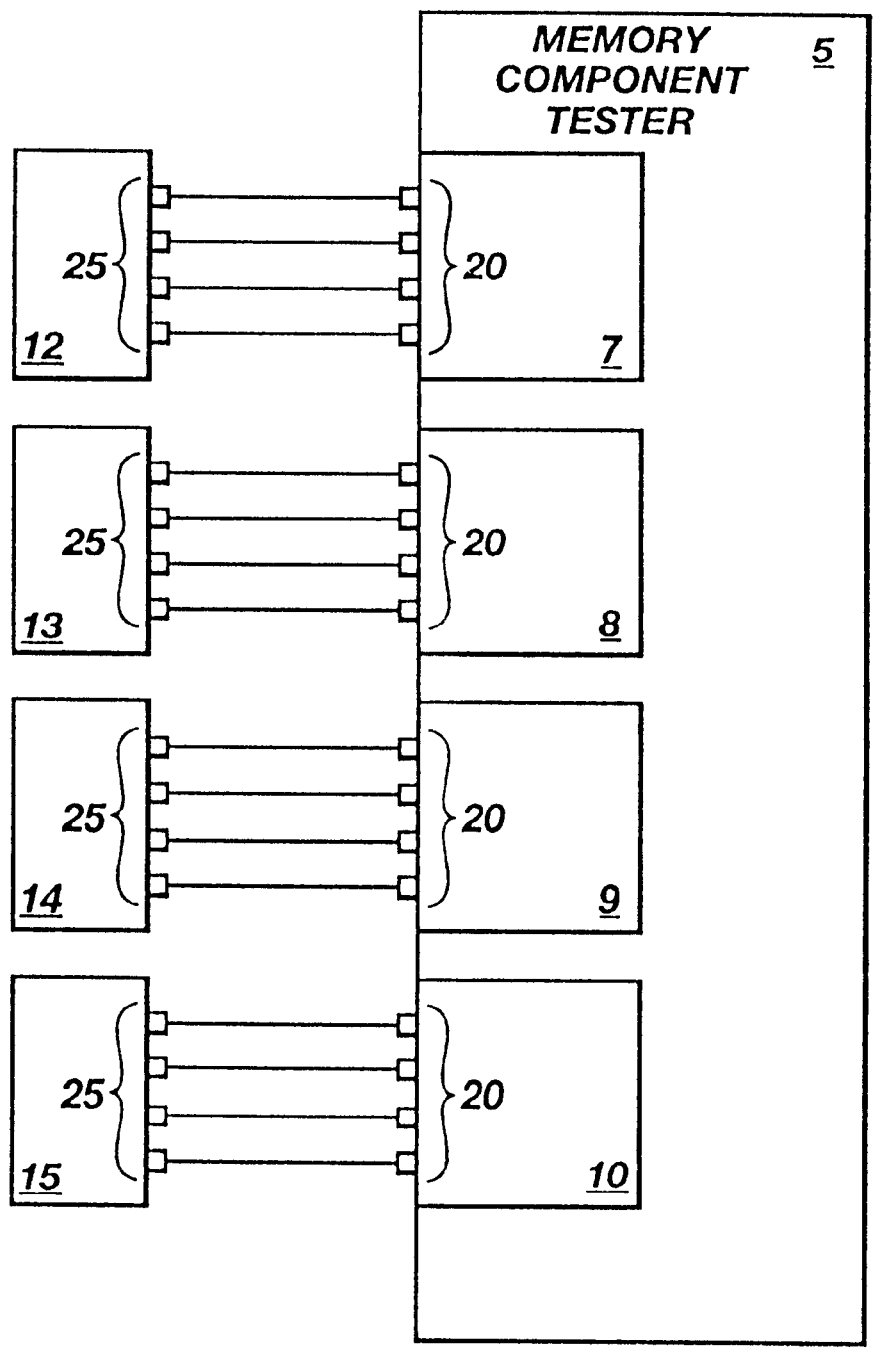
FIG. 1 is a block schematic of integrated circuits and a memory component tester of the related art.
Figure 2:
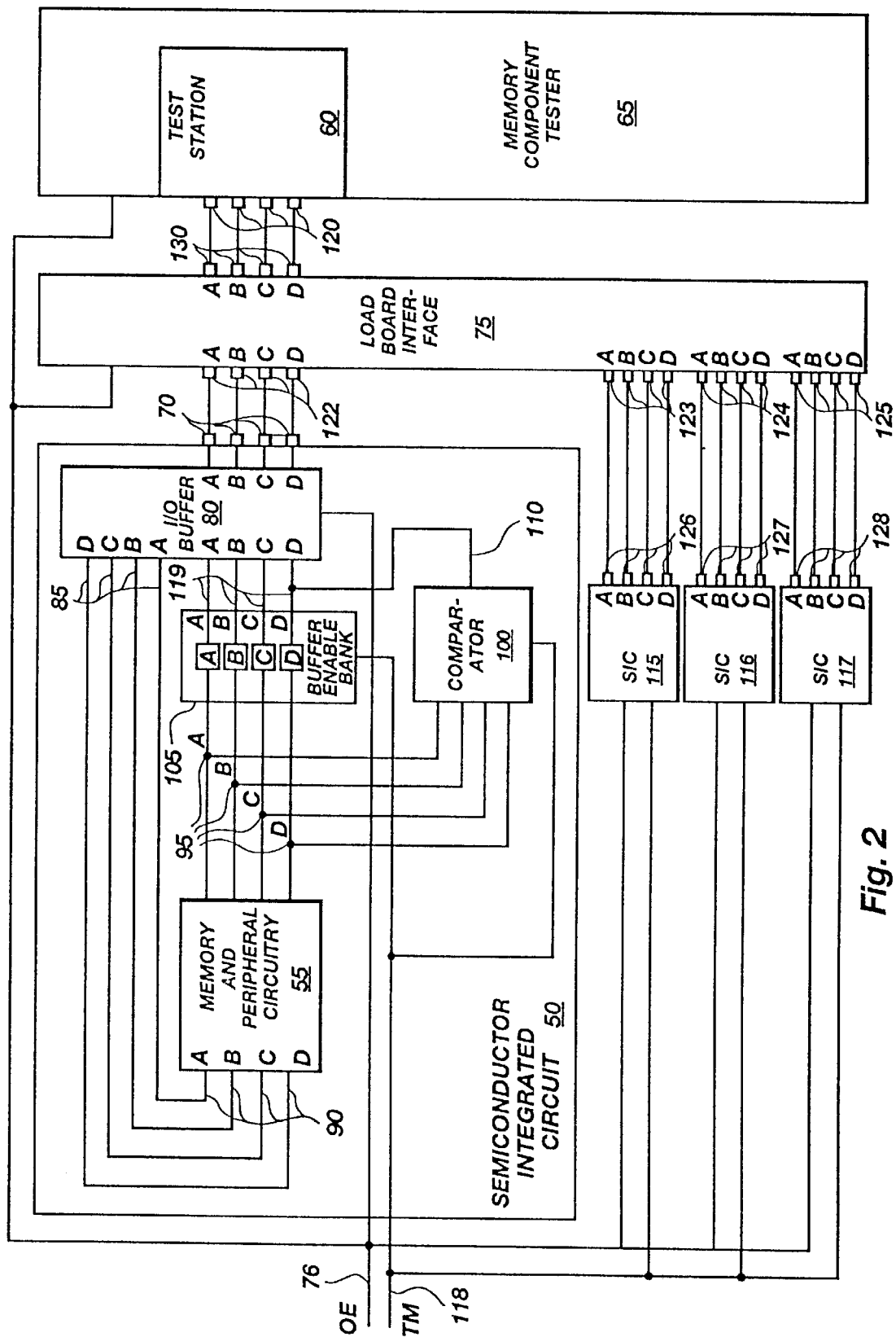
FIG. 2 is a block schematic of the semiconductor integrated circuit and a load board of the invention and a memory component tester.

FIG. 2 is a block schematic of a semiconductor integrated circuit 50 of one embodiment of the invention. The semiconductor integrated circuit 50 comprises memory and peripheral circuitry 55 for memory storage and retrieval in a user environment. During a test mode, typically performed subsequent to encapsulation of the semiconductor integrated circuit 50, input test data supplied by a test station 60 of a memory component tester 65 is applied on input/output (I/O) pins 70 having designations A–D. Designations A–D are used throughout this description to identify corresponding pins or nodes. A load board interface 75 of the invention couples the integrated circuit 50 to the test station 60. An output enable signal at node 76 controls an input/output buffer 80 to couple the input test data on input/output pins 70 to demux output nodes 85 during a test mode. The demux output nodes 85 are connected to input nodes 90 of the memory and peripheral circuitry 55. During normal operation the semiconductor integrated circuit 50 is disconnected from the load board interface 75 and input data is coupled from input/output pins 70 and input nodes 90 through the input/output buffer 80 in response to the output enable signal at node 76.

The memory and peripheral circuitry 55 respond to the input test data to provide output test data internally at nodes 95, which are input nodes to a test data comparator circuit 100 of the invention and a buffer enable bank 105 of the invention. The test data comparator circuit 100 compares the output test data at nodes 95 and provides a test output signal at comparator output node 110 when enabled by a test mode enable signal having a first logic state at test mode node 118. Therefore, the output test data at nodes 95 are compressed into one test output signal which indicates a pass or fail of the semiconductor integrated circuit 50. The comparator output node 110 is connected to one of the output nodes 119 of buffer enable bank 105, in this case D. The potential of the test output signal at comparator output node 110 has a first or second logic state, typically a high or a low, when all of the output test data at nodes 95 have a same logic state and a high impedance appears at comparator output node 110 when there is a difference in logic states of the output test data at nodes 95. When all of the output test data is the same, the memory and peripheral circuitry 55 is responding correctly to the input test data at nodes 90, and when at least two of the output test data have different logic states, the memory and peripheral circuitry 55 is not responding correctly to the input test data at nodes 90.

The buffer enable bank 105, with internal blocks A–D, drives a potential or presents a high impedance to nodes 119 as directed by the testmode signal at node 76. During a first test mode, a high impedance state is present on nodes 119, regardless of the value of the output test data at nodes 95, unless the high impedance is overridden by another signal such as the test output signal. Since the buffer enable bank 105 has driven node 119-D to a high impedance state during the first test mode, the test output signal on comparator output node 110 drives the potential of node 119-D to either a high or low logic state when the test data output at nodes 95 have a same logic state, and the high impedance state remains on node 119-D when there is a difference in the logic states of the output test data at nodes 95.

The load board interface 75 provides an electrical interface between four semiconductor integrated circuits 50 and 115–117 of the invention and four input/output (I/O) pins 120 of test station 60. Semiconductor integrated circuits 115–117 have the same internal circuitry as semiconductor integrated circuit 50. Therefore, components and component numbers described in semiconductor integrated circuit 50 are herein discussed as being in any of the semiconductor integrated circuits 115–117 of the invention. The load board interface 75 has four sets of pins 122–125 for connection to I/O pins 70 and I/O pins 126–128 of semiconductor integrated circuits 50 and 115–117, respectively. Each group of pins 122–125 are connected internally on the load board interface 75 to load board pins 130, which in turn are connected to pins 120. Thus, the test station 60 has the ability to apply input test signals to semiconductor integrated circuits 50 and 115–117 when connected to the circuits through the load board interface 75. Internal circuitry on load board interface 75 responds to the output enable signal to switch the internal connections of pins 123-D, 124-D and 125-D from pin 130-D to pins 130-C, 130-B, and 130-A, respectively, in order to supply a compressed test output signal from each of the semiconductor integrated circuits 50 and 115–117 to one test station, in this case test station 60, during the first test mode. Thus the semiconductor integrated circuit and load board interface of the invention allow one test station to simultaneously perform the circuit tests on four semiconductor integrated circuits rather than one.

Thus, during testing in the first test mode of the semiconductor integrated circuit 50, the test station I/O pin 120-D receives a compressed test output signal from I/O pin 70-D through internal circuitry of the load board interface 75. Similarly, pins 120-A,B and C receive compressed test output signals from I/O pins 128-D, 127-D, and 126-D respectively. The circuitry of test station 60 determines from the potential or impedance on pin 120 whether the semiconductor integrated circuits 50 and 115–117 meet circuit test requirements. When the potential has a high or low logic state, the semiconductor integrated circuit meets the circuit test requirements of the first test mode. When a pin 120 is held at a high impedance, at least one of the circuit functions creating the output test data at nodes 95 of the pertinent semiconductor integrated circuit 50 or 115–117 does not meet circuit test requirements of the first test mode.

Although device input and output nodes have been referred to as input "pins" and output "pins", the gender of the "pins" is not necessarily male and may very well be female. Typically, the "pins" of the semiconductor integrated circuit of the invention and the load board interface of the invention and the test station are made in order to couple two devices with a male/female connection.

In the case where at least one of the semiconductor integrated circuits does not meet at least one circuit test requirement of the first test mode, a second test mode can be enabled to determine which circuit test is failing. During the second test mode, all four I/O pins 70, 126, 127 or 128 of the faulty device are connected to pins 122A–D. The test mode signal switches state to a second logic state to disable comparator circuit 100 and enable the buffer enable bank 105 for the second test mode, thereby allowing the test data outputs at nodes 95 to be driven to the I/O pins 70, 126, 127, or 128 though the buffer enable bank 105 and the input/output buffer 80. Now the test station 60 of the memory component tester can determine which of the four tests, represented by the test data now driven to pins 120 by the load board interface 75, do not meet circuit requirements.

During normal operation, the buffer enable bank 105 is disabled for the first test mode and enabled for normal operation by the test mode signal having the second logic state at node 118 in order that user data can be driven from nodes 95 through the buffer enable bank 105 and the input/output buffer 80 to I/O pins 70, 126, 127, or 128.

The circuitry of the semiconductor integrated circuit of the invention, which compresses four test output signals to provide one test output signal in a first test mode, and the load board interface of the invention facilitate a reduction in hardware requirements during test and decrease test time. The hardware reduction is realized by the connection and testing of four semiconductor integrated circuits with one station rather than four test stations.

Although the semiconductor integrated circuits 50, 115–117 and load board interface 75 and test station 60 have been shown having groups of four I/O pins, the semiconductor integrated circuit and load board interface of the invention have applicability in cases where the number of I/O pins is greater or less than four. Thus, with an advent of more I/O pins, the number of semiconductor integrated circuits that can be simultaneously tested by one test station can be increased as long as the test station has a corresponding increase in I/Os.

Although the invention has been shown wherein a corresponding I/O pin D (70-D, 126-D,127-D, and 128-D) on all of the semiconductor integrated circuits 50 and 115–117 is connected to an input pin 120 of test station 60 through load board interface 75, any one of the I/O pins 70 and 126–128 A–D may be selected for connection by altering the load board interface circuitry in order to multiplex the I/O pins 70 and 126–128 differently to test station 60 during the analysis the compressed test output signals. Typically, this would occur in a case where the internal circuitry of the semiconductor integrated circuit of the invention is modified in order for the compressed output signal to appear at an I/O other than D.

Other variations include load board interface circuitry having two (or some other number) sets, rather than four sets of I/O pins 122–125, for connection to two semiconductor integrated circuits of the invention rather than four.

Figure 3:
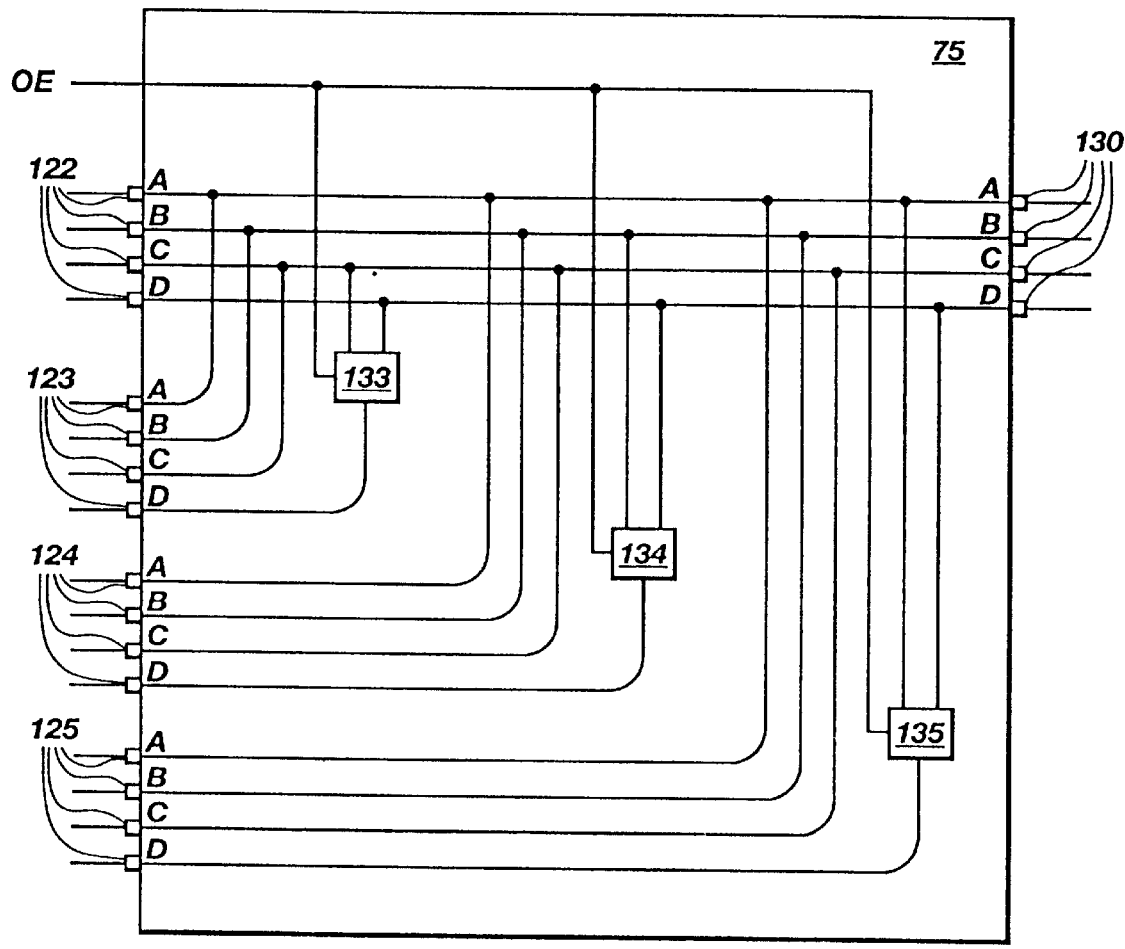
FIG. 3 is simplified block schematic of the load board of FIG. 2.

FIG. 3 is a simplified block schematic of one load board interface 75. Pins 123-D, 124-D, and 125-D are connected to switching circuits 133, 134, and 135 respectively. When the load board interface is connected to the test station 60 of FIG. 2, the switching circuits 133, 134 and 135 connect pin 130-D to pins 123-D, 124-D, and 125-D, respectively, when the test station 60 is supplying test input data to the semiconductor integrated circuits 50 and 115–117 of FIG. 2; and the switching circuits 133, 134, and 135 connect pins 123-D, 124-D, and 125-D to pins 130-C, 130-B, and 130-A, respectively, when the test station 60 is receiving a compressed test output signals from each of the semiconductor integrated circuits 50 and 115–117. The switching circuits switch between the two connections in response to the output enable signal at node 76.

Figure 4:
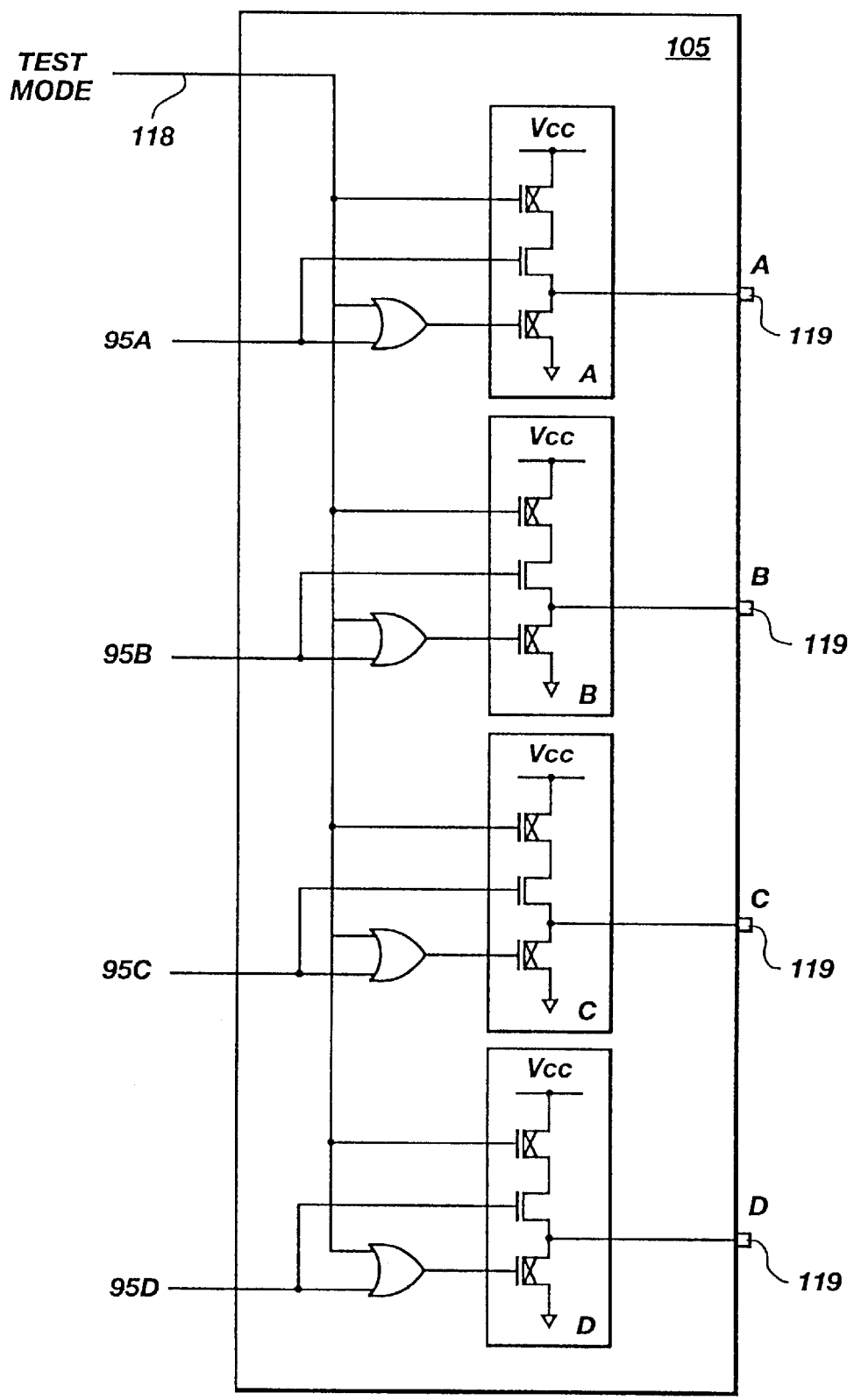
FIG. 4 is a schematic of the buffer bank shown in the block schematic of FIG. 2.

FIG. 4 is a schematic of the buffer enable bank 105. The circuitry in each block A–D is shown. It can be seen by studying the schematic that output nodes 119 have a high impedance when the test mode enable signal at node 118 is high, thereby disabling the buffer enable bank 105 during the first test mode. When the test mode enable signal is low, the test mode buffer enable bank 105 is enabled for the second test mode and for normal circuit operation. During the second test mode and during normal operation, the test output data or user data on nodes 95 is driven through the buffer enable bank 105 to nodes 119 and then through input/output buffer 80 to input/output pins 70 (see FIG. 2). The low test mode signal also disables the comparator circuit 100 during the second test mode or during normal operation. It is possible within the spirit and scope of the invention is use other circuitries to perform the function of the buffer enable bank 105.

Figure 5:
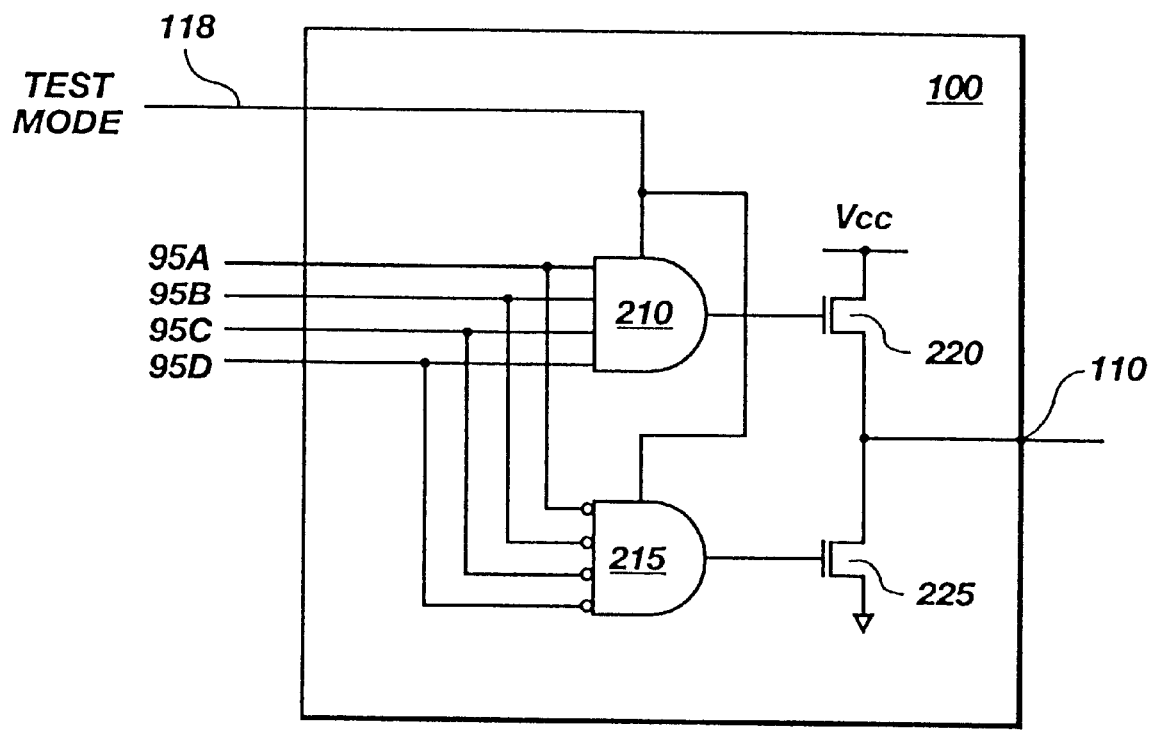
FIG. 5 is a schematic of the comparator circuit shown in the block schematic of FIG. 2.

FIG. 5 is the comparator circuit 100 of the semiconductor integrated circuit 50 of the invention. The test mode enable signal having the first logic state enables AND gate 210 and negative AND gate 215. When the output test data on all of the nodes 95 have a high logic state, the output of AND gate 210 is high which actuates NMOS transistor 220 driving comparator output node 110 to a potential having a high logic state indicating that the semiconductor integrated circuit passes the circuit tests. When the output test data on all of the nodes 95 have a low logic state, the output of negative AND gate 215 is high which actuates NMOS transistor 225, driving the potential of comparator output node 110 to a potential having a low logic state indicating that the semiconductor circuit passes the circuit test. When the potentials on nodes 95 have different logic states, the outputs of AND gate 210 and negative AND gate 215 are low and transistors 220 and 225 are deactuated. In this case, comparator output node 110 has a high impedance indicating that at least one of the data signals on nodes 95 is not correct. Thus, the comparator circuit 100 compresses the four output test data on nodes 95 into one test output signal at node 110. It is possible for other circuit implementations to replace the implementation shown in FIG. 5 without departing from the spirit and scope of the invention.

What is claimed is:

1. A semiconductor integrated circuit comprising:
    a) a memory portion for storing data and for generating internal output test data;
    b) output nodes for externally presenting the data stored;
    c) a comparator circuit in electrical communication with said memory portion, said comparator circuit internally comparing the internal output test data generated by the memory portion and generating a test output signal at a comparator circuit output node in response to the internal output test data, said test output signal having a potential when all of the internal output test data have a same logic state, said test output signal having a high impedance when the internal output test data have at least two different logic states, said comparator circuit output node in electrical communication with one of said output nodes; and
    d) a buffer circuit for enabling said output nodes to present the test output signal during a test mode.

2. The semiconductor integrated circuit as specified in claim 1, wherein:
    a) said test mode is a first test mode for determining if the semiconductor integrated circuit is faulty; and wherein
    b) said buffer circuit enables said output nodes to present the internal output test data during a second test mode for determining wherein lies a failure in the semiconductor integrated circuit when the semiconductor integrated circuit is found faulty during the first test mode.

3. The semiconductor integrated circuit as specified in claim 1, wherein said buffer circuit enables the output nodes for presenting the data stored during a normal memory operation.

4. A test system, comprising:
    a) a plurality of semiconductor integrated circuits; each comprising
        i) memory and peripheral circuitry for storage and retrieval of user data, said memory and peripheral circuitry capable of generating a plurality of internal output test data at internal intermediate nodes in response to input test data during a test mode;
        ii) a compression means for generating one test output signal at a compression node in response to the plurality of internal output test data, said test output signal indicating a passing state and a failing state of said memory and peripheral circuitry;
        iii) external input/output nodes for interfacing the semiconductor integrated circuit with external circuitries, one of said external input/output nodes accepting said test output signal; and
        iv) a buffer means for driving said external input/output nodes to a high impedance during the test mode regardless of a value of each of the internal output test data, said buffer means interposed between said internal intermediate nodes and the external input/output nodes; and
    b) a load board interface; comprising:
        i) sets of interface nodes, each of the interface nodes of the sets connectable to input/output nodes of one of the semiconductor irtegrated circuits of said plurality of semiconductor integrated circuits;
        ii) one set of tester nodes, connectable to one test station of a memory component tester; and
        iii) a switching means for electrically connecting each one of the one set of tester nodes to a corresponding interface node of each of the sets of the interface nodes, and for electrically connecting only one of the interface nodes of each of the sets of interface nodes to one of the one set of tester nodes.

5. A semiconductor integrated circuit comprising:
    a) memory and peripheral circuitry for storage and retrieval of user data, said memory and peripheral circuitry capable of generating a plurality of internal output test data at internal intermediate nodes in response to input test data during a test mode;
    b) a compression means for generating one test output signal at a compression node in response to the plurality of internal output test data, said test output signal indicating a passing state and a failing state of said memory and peripheral circuitry;
    c) external input/output nodes for interfacing the semiconductor integrated circuit with external circuitries, one of said external input/output nodes accepting said test output signal; and d) a buffer means for driving said external input/output nodes to a high impedance during the test mode regardless of a value of each of the plurality of internal output test data, said buffer means interposed between said internal intermediate nodes and the external input/output nodes, and wherein said buffer means drives said user data to said external input/output nodes during normal operation of the semiconductor integrated circuit.

6. The semiconductor integrated circuit as specified in claim 5, wherein said compression means is a comparator circuit, said comparator circuit comparing the plurality of internal output test data and generating a first test output signal when all of the plurality of internal output test data have a same logic state, and generating a second test output signal when at least two of the plurality of internal output test data have different logic states.

7. The semiconductor integrated circuit as specified in claim 6, wherein:
a) said first test output signal has one of a first logic state and a second logic state; and wherein
b) said second test output signal holds said one of said external input/output nodes accepting said test output signal at a high impedance state.

8. The semiconductor integrated circuit as specified in claim 5, wherein
a) said test mode is a first test mode; and wherein
b) said buffer means drives said plurality of internal output test data to said external input/output nodes during a second test mode.

9. The semiconductor integrated circuit as specified in claim 5, wherein a plurality of the semiconductor integrated circuits are connectable to a load board interface at their respective said external input/output nodes, said load board interface connectable to one test station of a memory component tester, said load board interface driving said test output signal of each of said plurality of semiconductor integrated circuits to the test station when connected thereto.

10. A test system, comprising:
a) a first integrated circuit having a first and a second input/output node;
b) a second integrated circuit having a first and a second input/output node;
c) a first integrated circuit connector for mating with said first and said second input/output nodes of said first integrated circuit;
d) a second integrated circuit connector for mating with said first and said second input/output nodes of said second integrated circuit;
e) a first test node connectable to said first input/output nodes of said first and said second integrated circuits when said first and said second integrated circuits are mated with said first and said second integrated circuit connectors, respectively;
f) a second test node connectable to said second input/output nodes of said first and said second integrated circuits when said first and said second integrated circuits are mated with said first and said second integrated circuit connectors, respectively; and
g) a switching means for switching a connection of said second input/output node of said second integrated circuit, when said second integrated circuit is mated with said second integrated circuit connector, from said second test node to said first test node.

11. The test system of claim 10, further comprising a means for driving a high impedance to said first and second input/output nodes of said first and said second integrated circuits.

12. The test system of claim 10, further comprising:
a) a first compression means for compressing at least two internal output test data of said first integrated circuit into one test output signal of said first integrated circuit, wherein said test output signal appears at said second input/output node of said first integrated circuit; and
b) a second compression means for compressing at least two internal output test data of said second integrated circuit into one test output signal of said second integrated circuit, wherein said test output signal of said second integrated circuit appears at said second input/output node of said second integrated circuit.

13. The test system as specified in claim 10, further comprising a test station connectable to said first and said second test nodes, said test station capable of supplying input test data to said first and second test nodes and capable of receiving the test output signals of the first and the second integrated circuits from said first and said second test nodes, the test output signals of the first and the second integrated circuits generated in response to the input test data.

14. A method for testing a semiconductor integrated circuit having output nodes, comprising the following steps:
a) enabling the output nodes for a test mode;
b) generating test data internally in the semiconductor integrated circuit in response to external input test stimuli;
c) comparing the test data internally in the semiconductor integrated circuit to determine when the test data have a same logic state and to determine when the test data have different logic states;
d) generating, at a selected output node of the output nodes, a circuit test signal having a logic state when all of the test data has the same logic state; and
e) driving a high impedance to the selected output node when the test data have the different logic states.

15. The method as specified in claim 14, wherein said enabling the output nodes for the test mode comprises driving the output nodes to a high impedance state.

16. The method as specified in claim 14, further comprising:
a) monitoring a potential and an impedance of the selected output node of the semiconductor integrated circuit with a test station; and
b) determining from said monitoring when the semiconductor integrated circuit passes the test and when the semiconductor integrated circuit fails the test.

17. The method as specified in claim 14, wherein the test mode is a first test mode and wherein the method further comprises:
a) enabling the semiconductor integrated circuit for a second test mode;
b) driving the test data to all of the output nodes of the semiconductor integrated circuit during the second test mode;
c) monitoring the potential of the output nodes with the test station; and
d) determining which of the test data is faulty.

18. The method as specified in claim 14, wherein the semiconductor integrated circuit is a first semiconductor integrated circuit and wherein the selected output node is a first selected output node and wherein the test data is first test data and wherein the circuit test signal is a first circuit test signal and wherein the method further comprises:

a) enabling output nodes of a second semiconductor integrated circuit during the test mode;

b) generating second test data internally in the second semiconductor integrated circuit in response to the external input test stimuli;

c) comparing the second test data internally in the second semiconductor integrated circuit to determine when the second test data have a same logic state and to determine when the second test data have different logic states;

d) generating, at a second selected output node of the first semiconductor integrated circuit, a second circuit test signal having a logic state when all of the second test data has a same logic state; and e) driving a high impedance to the second selected output node when the second test data have the different logic states.

19. The method as specified in claim 18, further comprising accepting the second test signal at the test station.

20. A method for testing a plurality of semiconductor integrated circuits, comprising:

a) driving external test stimuli to each of the semiconductor integrated circuits of the plurality from only one test station;

b) generating internal test data in said each of the plurality of semiconductor integrated circuits in response to the external test stimuli;

c) comparing the internal test data in said each of the plurality of semiconductor integrated circuits;

d) generating one test signal in said each of the semiconductor integrated circuits of the plurality in response to said comparing;

e) driving a high impedance to output nodes of said each of the plurality of semiconductor integrated circuits; and f) driving each of the test signals of said each of the plurality of semiconductor integrated circuits to one of the output nodes of a selected one of the plurality of semiconductor integrated circuits of the invention.

21. The method as specified in claim 20, further comprising:

a) accepting the test signals generated in said each of the plurality of semiconductor integrated circuits at the test station; and b) determining which of the plurality of semiconductor integrated circuits pass and which fail the testing.

22. The method as specified in claim 21, further comprising:

a) connecting a failed one of the plurality of semiconductor integrated circuits to the test station;

b) enabling each of the output nodes of the failed one of the plurality of semiconductor integrated circuits to accept the internal test data; and c) determining from the internal test data what tests the failed one of the plurality of semiconductor integrated circuits failed.

23. A test method, comprising:

a) supplying testing stimuli to a plurality of semiconductor integrated circuits;

b) generating internal responses to the testing stimuli in each of the plurality of semiconductor integrated circuits;

c) compressing the internal responses of said each of the plurality of semiconductor integrated circuits into one compressed signal for said each of the plurality of semiconductor integrated circuits;

d) receiving said one compressed signal from said each of the plurality of semiconductor integrated circuits at a single test station; and e) determining a passing and a failure of said each of the plurality of semiconductor integrated circuits from the one compressed signal.

24. A method for testing a first and a second integrated circuit with a single test station, comprising:

a) generating test results in the first and the second integrated circuits in response to test stimuli generated in the single test station;

b) compressing the test results to create a first and a second test signal in each of the first and the second integrated circuits, respectively c) receiving the first and the second test signals at the test station; and d) determining, from the first and the second test signals, when the first and the second semiconductor integrated circuits pass and fail the testing.

* * * * *